US012653037B2

(12) United States Patent
Tiziani et al.

(10) Patent No.: US 12,653,037 B2
(45) Date of Patent: Jun. 9, 2026

(54) METHOD OF MANUFACTURING SEMICONDUCTOR DEVICES AND CORRESPONDING SEMICONDUCTOR DEVICE

(71) Applicant: STMICROELECTRONICS S.r.l., Agrate Brianza (IT)

(72) Inventors: Roberto Tiziani, Nerviano (IT); Guendalina Catalano, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 458 days.

(21) Appl. No.: 18/191,726

(22) Filed: Mar. 28, 2023

(65) Prior Publication Data

US 2023/0230948 A1 Jul. 20, 2023

Related U.S. Application Data

(62) Division of application No. 17/199,340, filed on Mar. 11, 2021, now Pat. No. 11,626,379.

(30) Foreign Application Priority Data

Mar. 24, 2020 (IT) ........................ 102020000006223

(51) Int. Cl.
*H01L 21/04* (2006.01)
*H01L 21/56* (2006.01)
(Continued)

(52) U.S. Cl.
CPC ............ *H01L 24/19* (2013.01); *H01L 21/561* (2013.01); *H01L 23/49503* (2013.01); (Continued)

(58) Field of Classification Search
CPC ....... H01L 21/04; H01L 24/19; H01L 21/561; H01L 23/49503; H01L 24/24; H01L 24/96
See application file for complete search history.

(56) References Cited

U.S. PATENT DOCUMENTS 9,171,739 B1 10/2015 Roh et al.
10,937,726 B1 * 3/2021 Chen ................. H01L 23/49866
(Continued)

FOREIGN PATENT DOCUMENTS

CN 1375869 A 10/2002
CN 215933531 U 3/2022
(Continued)

OTHER PUBLICATIONS

"Supplementary: Customised Lead-Frame", accessed on Jun. 26, 2017, 10 pages, at http://www.mtarr.co.uk/courses/topics/0264_csp/supplementary/sup_01.html.

*Primary Examiner* — Mohammad M Choudhry
(74) *Attorney, Agent, or Firm* — Seed IP Law Group LLP

(57) ABSTRACT

A method comprises molding laser direct structuring material onto at least one semiconductor die, forming resist material on the laser direct structuring material, producing mutually aligned patterns of electrically-conductive formations in the laser direct structuring material and etched-out portions of the resist material having lateral walls sidewise of said electrically-conductive formations via laser beam energy, and forming electrically-conductive material at said etched-out portions of the resist material, the electrically-conductive material having lateral confinement surfaces at said lateral walls of said etched-out portions of the resist material.

20 Claims, 6 Drawing Sheets

(51) Int. Cl.
H01L 23/00 (2006.01)
H01L 23/495 (2006.01)

(52) U.S. Cl.
CPC .............. H01L 24/24 (2013.01); H01L 24/96 (2013.01); H01L 2224/24175 (2013.01)

(56) References Cited

U.S. PATENT DOCUMENTS

| | | |
|---|---|---|
| 2002/0102745 A1 | 8/2002 | Lahiri et al. |
| 2006/0289203 A1 | 12/2006 | Oda |
| 2012/0120623 A1 | 5/2012 | Baek et al. |
| 2015/0021754 A1 | 1/2015 | Lin et al. |
| 2015/0279778 A1 | 10/2015 | Camacho et al. |
| 2016/0100256 A1 | 4/2016 | Watson et al. |
| 2016/0183369 A1 | 6/2016 | Talledo et al. |
| 2017/0077043 A1 | 3/2017 | Takemura et al. |
| 2017/0367182 A1 | 12/2017 | Wu et al. |
| 2018/0053731 A1 | 2/2018 | Sommer et al. |
| 2018/0068935 A1 | 3/2018 | Teysseyre et al. |
| 2018/0342433 A1 | 11/2018 | Ziglioli et al. |
| 2018/0342453 A1 | 11/2018 | Ziglioli |
| 2019/0115287 A1 | 4/2019 | Derai et al. |
| 2019/0198454 A1 | 6/2019 | Talledo |
| 2020/0161206 A1 | 5/2020 | Hu et al. |
| 2020/0185293 A1 | 6/2020 | Schmalzl et al. |
| 2021/0013134 A1 | 1/2021 | Derai et al. |
| 2021/0130970 A1 * | 5/2021 | Desalvo ................. H05K 1/181 |
| 2021/0166987 A1 | 6/2021 | Hu et al. |

FOREIGN PATENT DOCUMENTS

| | | | |
|---|---|---|---|
| GB | 2 313 713 A | 12/1997 | |
| JP | 2004087628 A | 3/2004 | |
| JP | 2009016711 A | 1/2009 | |
| JP | 2009081208 A | 4/2009 | |
| JP | 2011254026 A | 12/2011 | |
| JP | 2013251368 A | 12/2013 | |
| JP | 2016143813 A | 8/2016 | |
| JP | 2016146394 A | 8/2016 | |
| WO | WO 2015003175 A1 | 1/2015 | |
| WO | WO-2020231871 A1 * | 11/2020 | ............ H05K 1/115 |

* cited by examiner

METHOD OF MANUFACTURING SEMICONDUCTOR DEVICES AND CORRESPONDING SEMICONDUCTOR DEVICE

BACKGROUND

Technical Field

The present disclosure relates to embodiments of methods of manufacturing semiconductor devices, which may be applied to manufacturing semiconductor devices such as integrated circuits (ICs).

Description of the Related Art

Manufacturing semiconductor devices (e.g., integrated circuits (ICs)) is an area of technology, which has attracted extensive research activity.

Despite the extensive research activity in this area of manufacturing semiconductor devices, further improved solutions are desirable.

BRIEF SUMMARY

The object of one or more embodiments of the present disclosure is to contribute in providing improved solutions in the manufacture of semiconductor devices.

One or more embodiments may provide various types of improvements in semiconductor device packages.

For instance, one or more embodiments may facilitate:
  preventing copper (Cu) growth laterally of electrically-conductive formations in electroplating process;
  obtaining Cu growth over the surface of a laser direct structuring (LDS) material with substantially vertical edges;
  reducing the pitch of Cu tracks, meeting design constraints of 25/25 μm line/space, for instance.

One or more embodiments may be used on QFN (Quad-Flat No-lead), BGA (Ball Grid Array)/LGA (Land Grid Array) or QFP (Quad Flat Package or Pack) packages. QFN (Quad-Flat No-lead) is a package type with a metallic leadframe with flat leads fully incorporated in a molding compound. BGA/LGA is a package type characterized by solder ball/land incorporated in a molding compound made with organic substrate. QFP is a package type with metallic leadframe and gull wing leads.

BRIEF DESCRIPTION OF THE SEVERAL VIEWS OF THE DRAWINGS

It will be appreciated that for the sake of clarity and ease of understanding the various figures may not be drawn to a same scale.

One or more embodiments will now be described, by way of example only, with reference to the figures, wherein.

DETAILED DESCRIPTION

Figures 1, 2A, 2B:
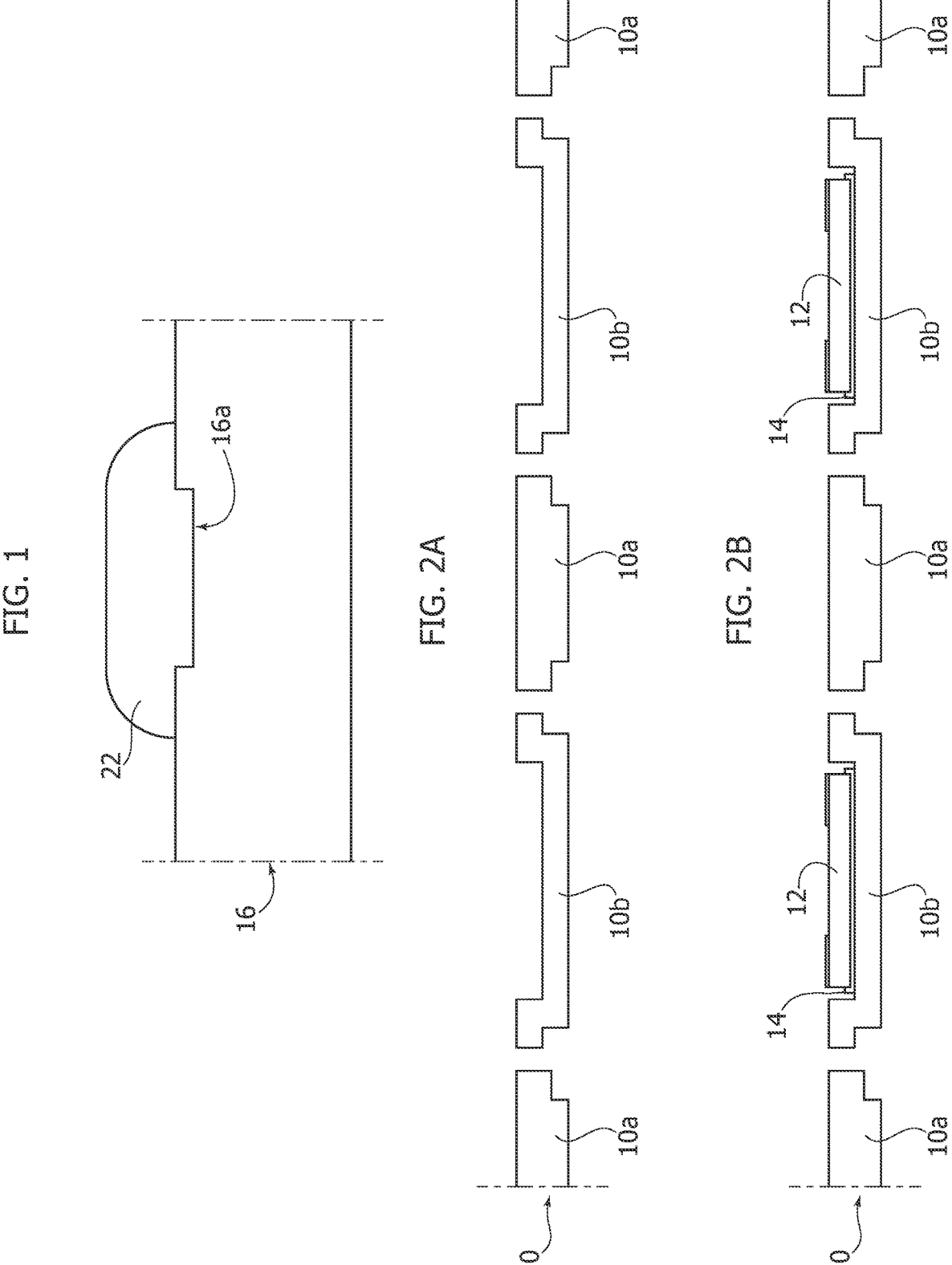
FIG. 1 is a cross-sectional view of an electrically-conductive formation with lateral Cu growth.
FIGS. 2A to 2J are exemplary of possible acts or steps in embodiments of the present disclosure or within the scope of the present disclosure.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment," "in one embodiment," or the like, that may be present in various points of the present description do not necessarily refer exactly to one and the same embodiment. Furthermore, particular conformations, structures, or characteristics may be combined in any adequate way in one or more embodiments.

The terms "vertical," "upper," and "bottom," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The headings/references used herein are provided merely for convenience and hence do not define the extent of protection or the scope of the embodiments.

In semiconductor device manufacturing, electrical connection between leadframes or substrates and semiconductor chips or dice arranged thereon can be provided in the form of metal wiring (so-called wire-bonding technology may be exemplary of such an approach).

An insulating compound (an epoxy molding compound, for instance) can be molded onto a leadframe or substrate to encapsulate a semiconductor die or dice arranged thereon.

Recent developments in that area (as witnessed by documents such as US 2018/342433 A1, US 2018/342453 A1 or US 2019/115287 A1, for instance) disclose the possibility of using for that purpose an additive molding compound, e.g., laser direct structuring (LDS) material.

Laser direct structuring (LDS) is a laser-based machining technique now widely used in various sectors of the industrial and consumer electronics markets, for instance for high-performance antenna integration, where an antenna design can be directly formed onto a molded plastic part. In an exemplary process, the molded parts can be produced with commercially available resins which include additives suitable for the LDS process; a broad range of resins such as polymer resins like PC (polycarbonate), PC/ABS (Acrylonitrile Butadiene Styrene), ABS, and LCP (liquid crystal polymer) are currently available for that purpose.

In LDS, a laser beam can be used to transfer a desired electrically-conductive pattern onto a plastic molding which may then be subjected to metallization (for instance via electroless plating with copper or other metals) to finalize a desired conductive pattern.

For instance, once electrically-conductive formations, such as lines or vias, are structured in an LDS material "activated" via a laser beam, electrical conductivity of these formation can be facilitated by forming electrically-conductive material thereon. This may involve, for instance, forming a thin film by immersion into a copper (Cu) electroless bath, followed by galvanic Cu growth, this resulting in thick Cu tracks formed which connect the semiconductor die or dice and the leads.

The electrically conductive formations 20a, 20b and the electrically conductive material may be referred to as an electrically conductive structure, which has a U-shape like structure as shown in FIGS. 2G-2J.

Direct copper interconnection has been regarded as hardly applicable to devices with fine pitch, that is with reduced spacing between adjacent electrically-conductive formations. Galvanic Cu growth is essentially isotropic and may thus imply lateral Cu growth over the electrically-conductive formations.

This is exemplified in FIG. 1 where reference numeral 16 denotes a substrate having a recessed portion 16a formed therein. This may be the case of a substrate of an LDS material exposed to laser beam activation energy to structure therein an electrically-conductive formation (a conductive line, for instance) at 16a. Reference 22 denotes an electrically-conductive (e.g., Cu) track or trace formed at 16a as discussed previously, and thus exhibiting some sort of lateral growth.

Such lateral growth places a constraint on the gap between adjacent conductive formations: in fact, too close a spacing may lead to undesired contact (short circuit) between adjacent formations.

Consequently, applying conventional LDS technology as discussed so far to provide such formations (tracks or vias, for instance) involves designing such formations with a separation (pitch) wide enough to facilitate avoiding undesired contact between adjacent formations after Cu plating.

For instance (of course these figures are purely exemplary and non-mandatory) a conductive track having a width of 80 μm (resulting from laser beam activation of the LDS material) may eventually become 180 μm wide as a result of a 50 μm Cu lateral growth at each side of a track having 50 μm Cu plating growth.

Conventional LDS technology as discussed so far is thus hardly applicable to "fine pitch" tracks or traces as desirable in application such as, for instance, smart power silicon technology, e.g., with 20 μm (minimum) laser spot and thick Cu plating.

It is also observed that conventional LDS technology as discussed so far may lead to Cu spikes formed at corners or at vias due to uneven current density.

One or more embodiments may facilitate preventing lateral Cu growth over electrically-conductive formations.

In one or more embodiments, Cu tracks resulting from Cu growth over electrically-conductive formations may have substantially vertical edges.

FIGS. 2A to 2J are exemplary of various acts which may be implemented in fabricating semiconductor products 100.

FIG. 2A is exemplary of the provision of leadframe material 10 (Cu sheet, for instance).

The designation "leadframe" (or "lead frame") is currently used (see, for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts.

Essentially, a leadframe comprises an array of electrically-conductive formations (leads) 10a which from an outline location extend inwardly in the direction of a semiconductor chip or die thus forming an array of electrically-conductive formations from a die pad 10b.

As conventional in the art, such a leadframe 10 may be provided in the form of a strip of notionally indefinite length where a plurality of devices is formed, with the individual devices thus formed finally separated by a final "singulation" act.

To that effect the leadframe 10 may be provided along its length with fiducials, not visible in the figure for simplicity.

FIG. 2B is exemplary of semiconductor dice 12 being attached onto the die pads 10b in the leadframe 10. This may be via die attach adhesive 14 (DAF or standard glue dispensing, for instance), which is not expressly indicated with a reference symbol in the subsequent figures for clarity of illustration.

Figures 2C, 2D:
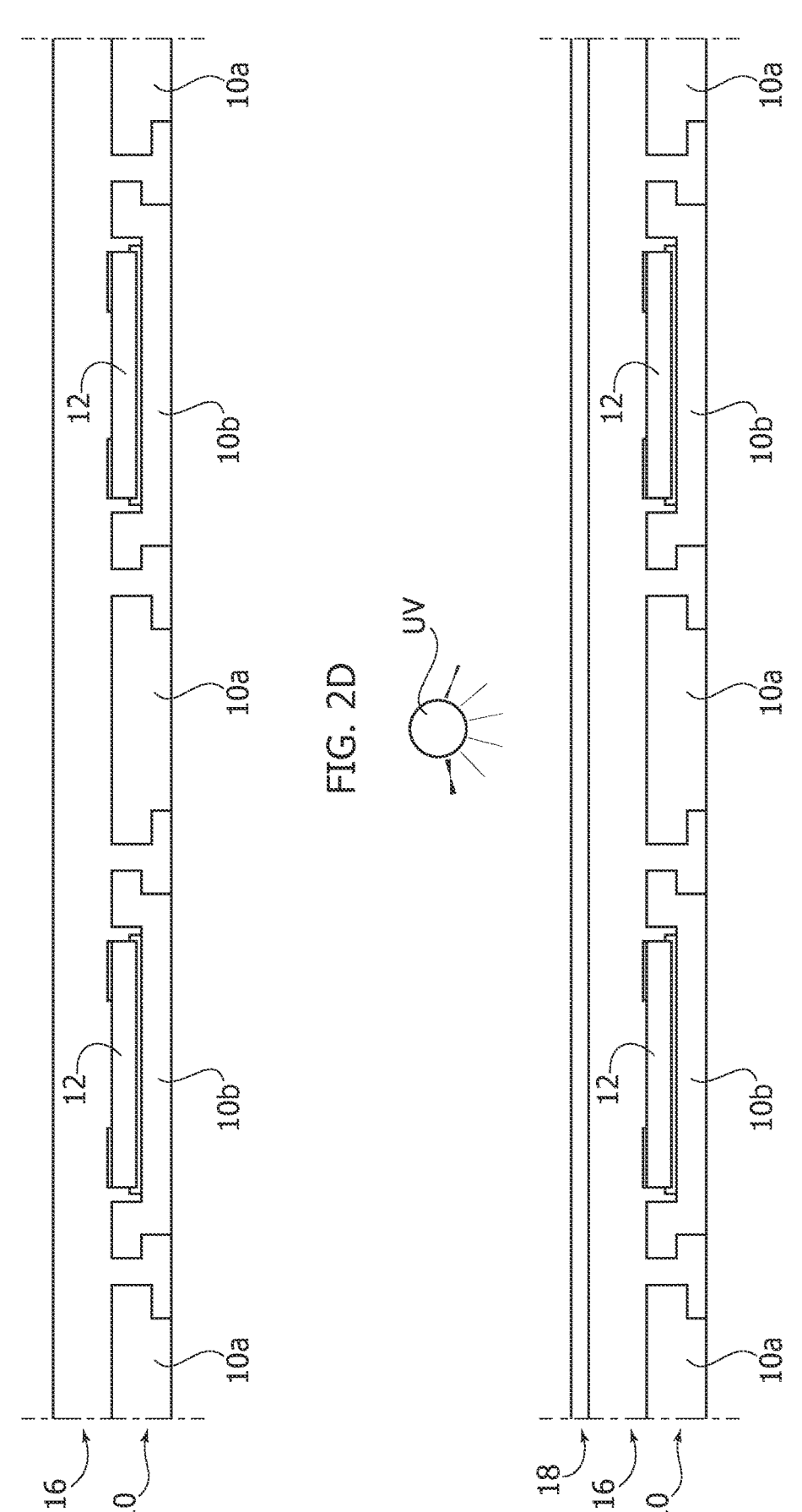

FIG. 2C is exemplary of LDS molding compound 16 being molded onto the surface resulting from the act of FIG. 2B.

In one or more embodiments, the LDS molding compound 16 may provide a (per se electrically-insulating) encapsulation of the semiconductor die 12, possibly extending into the spaces between the leads 10a and the die pad 10b in the leadframe 10.

As discussed, an LDS compound as 16 may comprise any of a broad range of LDS materials, for instance resin such as polymer thermoplastic resins like polycarbonate (PC), polycarbonate/acrylonitrile butadiene styrene (PC/ABS), acrylonitrile butadiene styrene (ABS), liquid-crystal polymer (LCP) and thermoset epoxy resins are currently available for that purpose.

FIG. 2D is exemplary of a layer of resist material 18 being formed (deposited, for instance) onto the LDS material 16.

Use of such resist materials is conventional in the area of manufacturing semiconductor devices such as integrated circuits, which makes it unnecessary to provide a more detailed description herein.

Briefly, the designation resist applies to a layer of material which can be used to transfer a desired circuit pattern onto a substrate. Such a layer can be patterned in various ways to form a mask intended to protect certain regions of the substrate during subsequent processing steps.

In one or more embodiments as exemplified herein, the (continuous) layer 18 includes resist material which can be hardened by resorting to light exposure (from a source designated UV in FIG. 2D) after being formed onto the LDS material 16.

In one or more embodiments, the layer of resist material 18 may be selected out of solder resist, epoxy material, adhesive tape and photoresist material: those of skill in the art will otherwise easily appreciate that these are merely exemplary, non-mandatory options.

DuPont Riston 200 Series is exemplary of resist material which may be advantageously used in one or more embodiments.

Figure 2E:
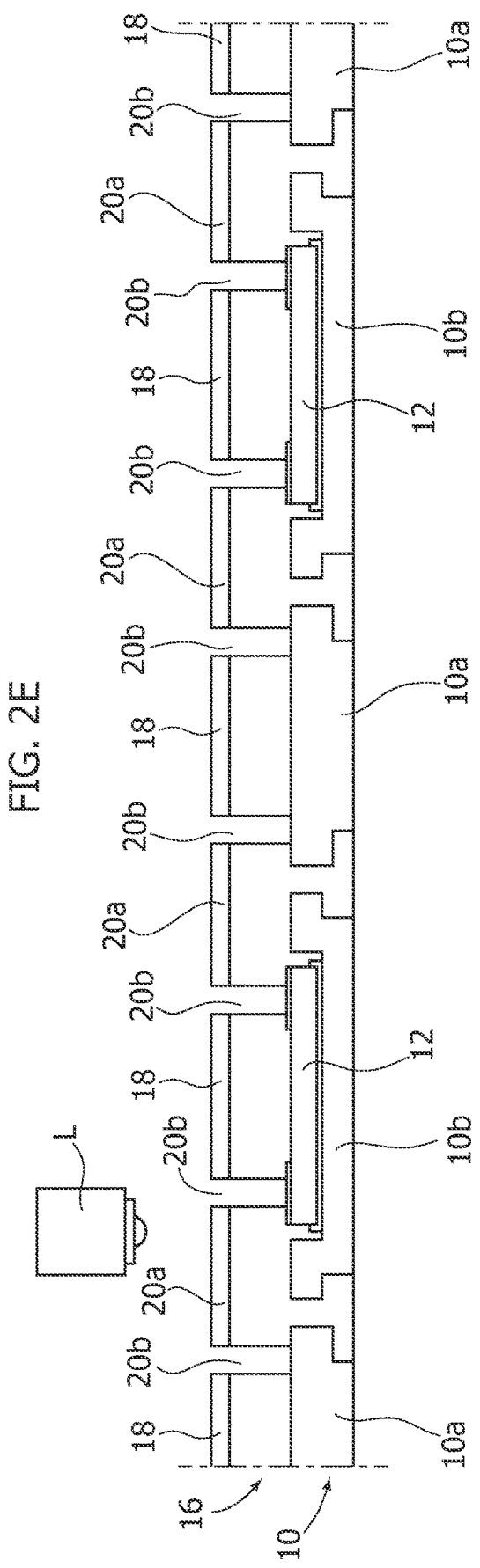

FIG. 2E is exemplary of electrically-conductive formations structured in the LDS material 16 with "activation" laser beam energy applied as exemplified by L.

As exemplified herein, such electrically-conductive formations comprise lines or traces 20a at the surface of the compound 16 and vias 20b extending through the compound 16 between opposed surfaces of the compound layer.

In one or more embodiments as exemplified herein, lines or traces 20a and vias 20b are structured by laser beam energy traversing the resist layer 18.

For instance, this may involve the (at least partial) evaporation or ablation of the layer of resist material 18 under the action of the laser beam energy.

In one or more embodiments as exemplified herein, such laser beam etching of the layer of resist material 18 will result in trenches (slits or grooves) or holes being formed in the resist material 18 which are self-aligned with the lines/vias structured in the LDS material 16.

Figure 2F:
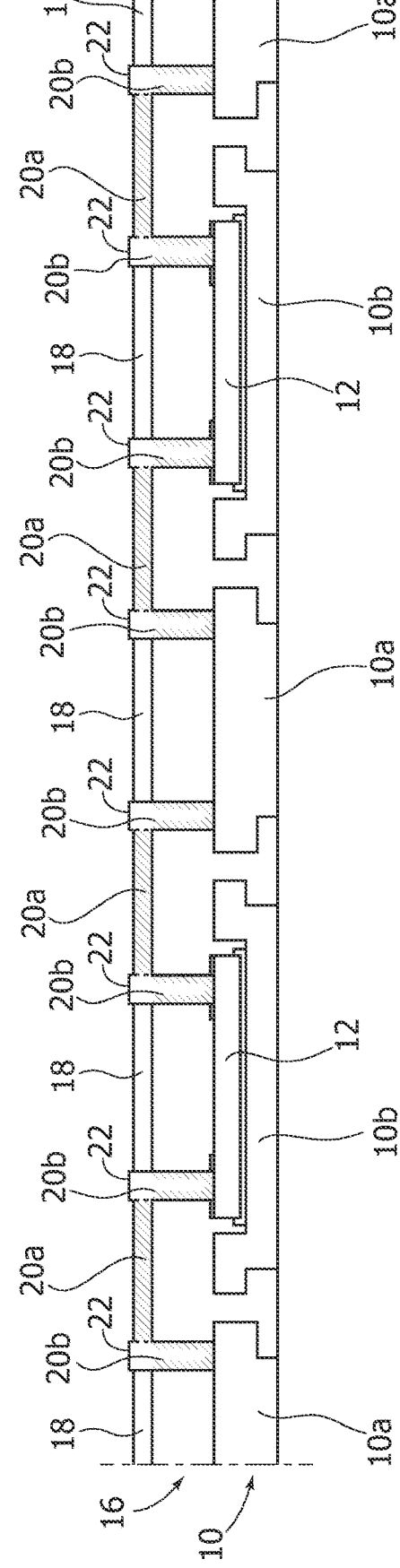

FIG. 2F is exemplary of metallization via Cu electroplating of lines 20a and/or vias 20b to facilitate their electrical conductivity.

In one or more embodiments, the thickness of the formed Cu layer may be 50 to 70 μm.

Figure 3:
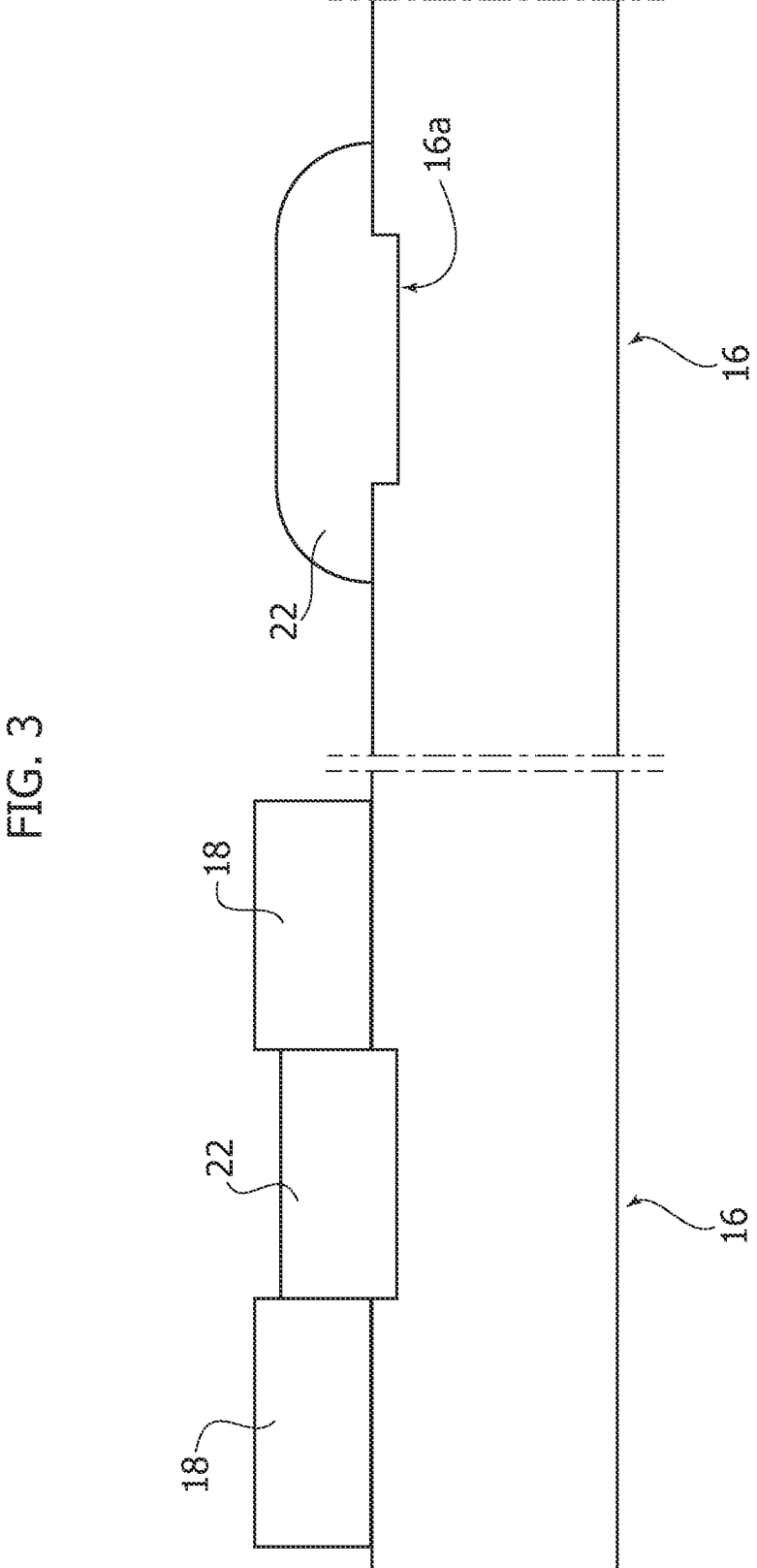
FIG. 3 is a cross-sectional view of an electrically-conductive formation in one or more embodiments of the present disclosure or within the scope of the present disclosure.

As exemplified in FIG. 3, the (self)alignment of:

the side walls of trenches (slits or grooves) or holes formed by the action of laser beam (as exemplified at L in FIG. 2E) in the resist material 18, the lines/vias structured in the LDS material compound 16 resulting from the act of FIG. 2E, facilitates preventing Cu growth laterally of lines 20a and/or vias 20b, so that electrically-conductive formations (Cu formations) 22 with substantially vertical edges are obtained.

This result is highlighted on the left-hand side of FIG. 3 by way of direct comparison with the conventional solution of FIG. 1, which is once again reproduced on the right-hand side of FIG. 3.

The representation on the left-hand side of FIG. 3 also shows that, in one or more embodiments, the electrically-conductive formations 22 may end up by having a front (upper) surface which is substantially level with the surface of the resist layer 18 (with no growth—also—over the resist surface).

This may facilitate forming electrically-conductive formations 22 which fill the volume formed in the resist layer 18, thus having a thickness which may reach up to the height/depth of the trenches or holes formed by the action of laser beam.

Figures 2G, 2H:
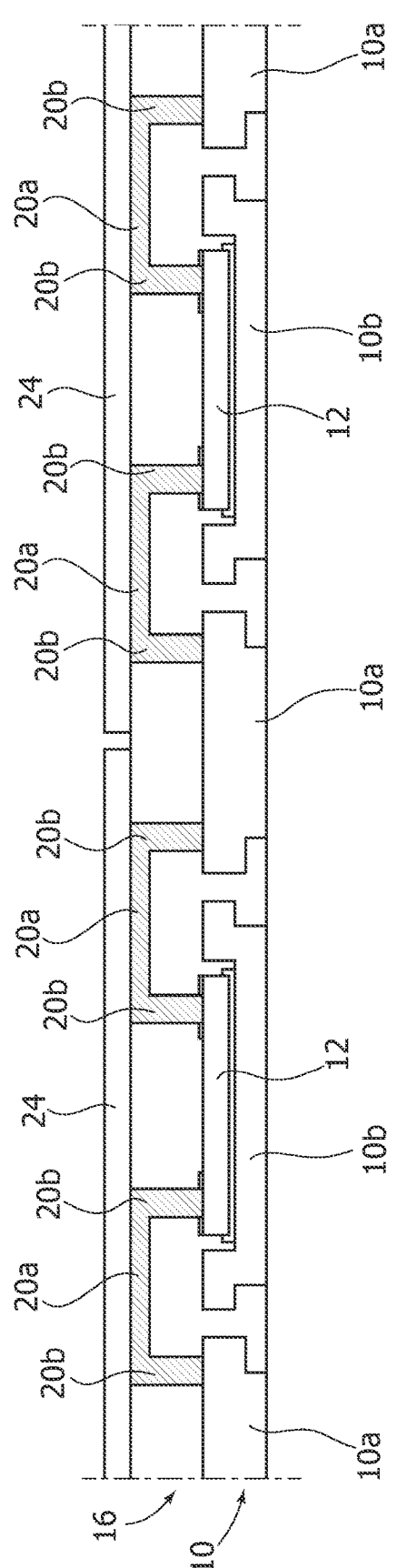

FIG. 2G is exemplary of possible (non-mandatory) removal of the layer of resist material 18, which can be performed with any process known to those of skill in the art for that purpose.

FIG. 2H is exemplary of possible further steps in completing the packaging of the product 100 (possibly after resist removal as exemplified in FIG. 2G).

For instance, the layer designated 24 in FIG. 2H may be exemplary of (further) package molding compound molded onto the assembly of FIG. 2F (possibly after resist removal as exemplified in FIG. 2G). In one or more embodiments, the (further) mass of package molding compound 24 may include conventional (that is, non-LDS) molding compound such as an epoxy molding compound (EMC).

The layer designated 24 in FIG. 2H may be likewise exemplary of stencil printing of solder coat (around 100 μm thickness, for instance) onto the assembly of FIG. 2F (again possibly after resist removal as exemplified in FIG. 2G).

Figures 2I, 2J:
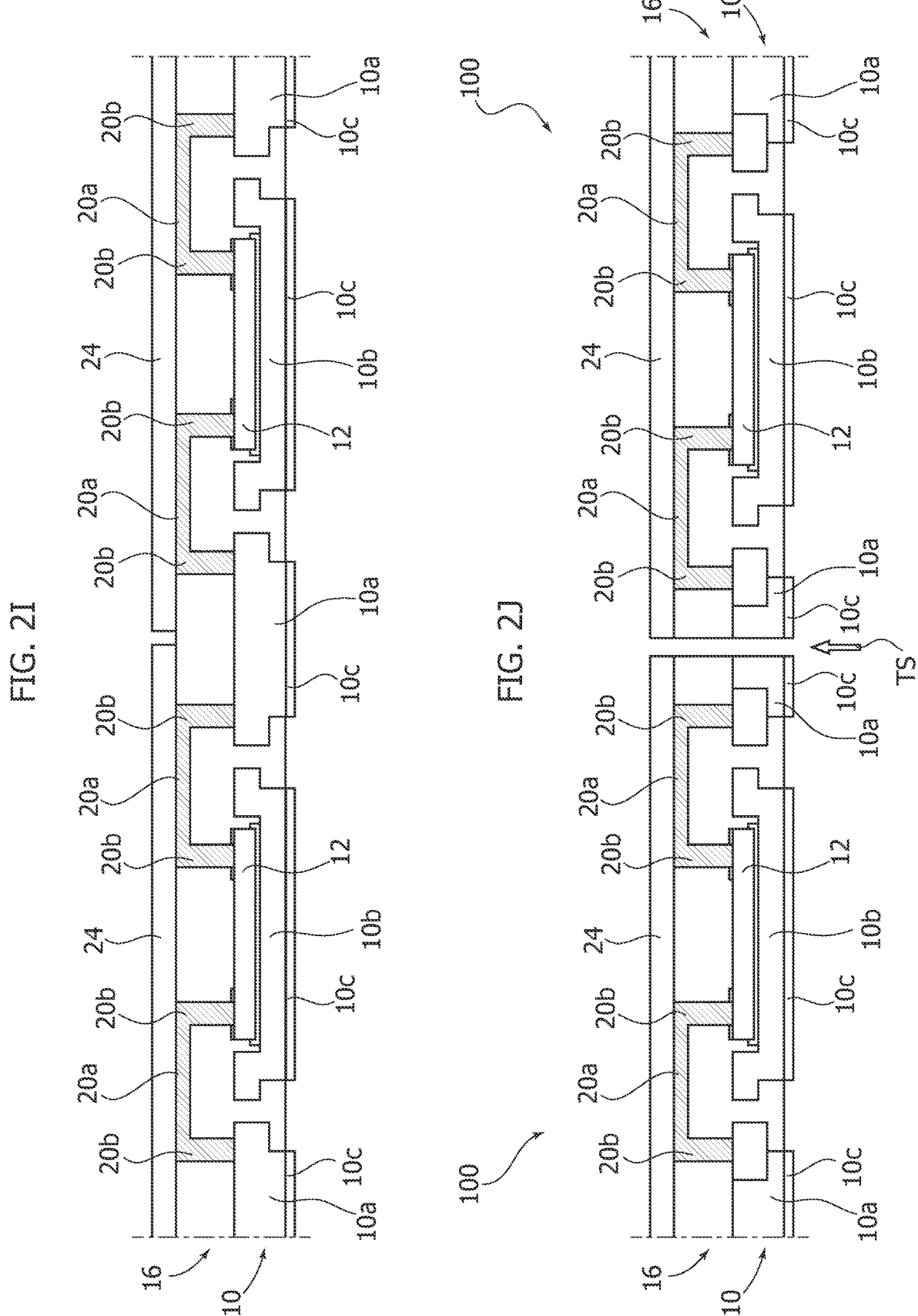

FIG. 2I is exemplary of possible metal plating (tin plating, for instance) 10c formed at the bottom (back) surface of the leadframe 10.

FIG. 2J is exemplary of an act of singulation via a conventional singulation tool as exemplified at TS to form individual semiconductor devices 100.

A method as exemplified herein may comprise:

molding laser direct structuring material (for instance, 16) onto at least one semiconductor die (for instance, 12) to provide at least partial encapsulation thereof, forming resist material (for instance, 18) on the laser direct structuring material, applying laser beam energy (for instance, L) to the laser direct structuring material through the resist material formed thereon, wherein said laser beam energy produces mutually aligned patterns of electrically-conductive formations (for instance 20a, 20b) structured in the laser direct structuring material and etched-out portions of the resist material, said etched-out portions of the resist material leaving said electrically-conductive formations uncovered and having lateral walls sidewise of said electrically-conductive formations, and forming electrically-conductive material (for instance, 22) on said electrically-conductive formations in the laser direct structuring material at said etched-out portions of the resist material, wherein said electrically-conductive material has lateral confinement surfaces at said lateral walls of said etched-out portions of the resist material.

In a method forming the etched-out portions, which may be formed by removing portions of the resist material 18 includes forming openings at locations along the resist material 18 where the etched-out portions have been removed.

In a method as exemplified herein, forming electrically-conductive material on said electrically-conductive formations structured in the laser direct structuring material may comprise growing electrically-conductive material at said etched-out portions of the resist material.

In a method as exemplified herein, growing electrically-conductive material at said etched-out portions of the resist material may comprise immersing the laser direct structuring material and the resist material formed thereon having mutually aligned patterns of electrically-conductive formations and etched-out portions in a metal-containing bath.

In a method as exemplified herein, growing electrically-conductive material at said etched-out portions of the resist material may comprise:

growing a first, thin layer of electrically-conductive material on said electrically-conductive formations in the laser direct structuring material, growing a second, thick layer of electrically-conductive material on said first, thin layer of electrically-conductive material.

A method as exemplified herein may comprise:

growing said first layer of electrically-conductive material via an electroless bath, and growing said second layer of electrically-conductive material via galvanic growth.

In a method as exemplified herein, said electrically-conductive material formed on said electrically-conductive formations structured in the laser direct structuring material may comprise copper.

In a method as exemplified herein, said resist material may be selected out of solder resist, epoxy material, adhesive tape and photoresist material.

In a method as exemplified herein, said electrically-conductive formations structured in the laser direct structuring material may comprise:

electrically-conductive lines (for instance, 20a) over the laser direct structuring material, and/or electrically-conductive vias (for instance, 20b) through the laser direct structuring material.

A method as exemplified herein may comprise removing said resist material formed on the laser direct structuring material subsequent to forming said electrically-conductive material on said electrically-conductive formations in the laser direct structuring material at said etched-out portions of the resist material.

A device (for instance, 100) as exemplified herein may comprise:

laser direct structuring material molded onto at least one semiconductor die to provide at least partial encapsulation thereof, a pattern of laser-beam activated, electrically-conductive formations structured in the laser direct structuring material, and electrically-conductive material formed on said electrically-conductive formations structured in the laser direct structuring material, wherein said electrically-conductive material formed on said electrically-conductive formations has lateral confinement surfaces aligned with said pattern of laser-beam activated, electrically-conductive formations in the absence of lateral growth with respect thereto.

Without prejudice to the underlying principles, the details and the embodiments may vary, even significantly, with respect to what has been described by way of example only without departing from the scope of the embodiments.

The extent of protection is determined by the annexed claims.

The various embodiments described above can be combined to provide further embodiments. All of the U.S. patents, U.S. patent application publications, U.S. patent applications, foreign patents, and foreign patent applications listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

forming a resin material onto at least one semiconductor die at least partially encapsulating the at least one semiconductor die, wherein the resin material is a laser direct structuring material;

forming a resist material on the resin material;

forming and structuring mutually aligned patterns of electrically-conductive formations within the resin material by applying a laser to the resin material and the resist material, the forming and structuring the electrically-conductive formations including:

forming openings in the resist material exposing the electrically-conductive formations and forming lateral walls of the resist material adjacent to the electrically-conductive formations by removing portions of the resist material; and forming electrically-conductive material on the electrically-conductive formations structured in the laser direct structuring material at the openings in the resist material, wherein forming the electrically-conductive material on the electrically-conductive formations in the laser direct structuring material comprises growing the electrically-conductive material at the openings of the resist material, wherein the electrically-conductive material has lateral confinement surfaces at the lateral walls of the resist material, and wherein growing the electrically-conductive material at the openings of the resist material comprises:

growing a first layer of electrically-conductive material on said electrically-conductive formations structured in the laser direct structuring material; and growing a second layer of electrically-conductive material on said first layer of electrically-conductive material, the second layer being thicker than the first layer.

2. The method of claim 1, wherein growing electrically-conductive material at the openings of the resist material further comprises immersing the laser direct structuring material, the resist material, and the electrically-conductive formations structured in the laser direct structuring material at the openings in a metal-containing bath.

3. The method of claim 1, further comprising:

growing the first layer of electrically-conductive material via an electroless bath; and growing the second layer of electrically-conductive material via galvanic growth.

4. The method of claim 1, wherein said electrically-conductive material formed on the electrically-conductive formations structured in the laser direct structuring material further comprises a copper material.

5. The method of claim 1, wherein said resist material is selected from at least one of the following of a solder resist, an epoxy material, an adhesive tape, and a photoresist material.

6. The method of claim 1, wherein the electrically-conductive formations structured in the laser direct structuring material further comprises:

electrically-conductive lines over the laser direct structuring material; and electrically-conductive vias through the laser direct structuring material.

7. The method of claim 1, comprising removing the resist material formed on the laser direct structuring material subsequent to forming said electrically-conductive material on the electrically-conductive formations structured in the laser direct structuring material at the openings of the resist material.

8. A method, comprising:

forming a resist material on a surface of an additive molding compound overlapping a die within the additive molding compound;

exposing a laser to the resist material and the additive molding compound, exposing the laser to the resist material and the additive molding compound including:

forming a first via opening extending to a lead portion of a leadframe through the resist material and the additive molding compound;

forming a second via opening extending to a contact pad of the die through the resist material and the additive molding compound;

activating an additive conductive material within the additive molding compound forming a first conductive layer extending along a first lateral sidewall that delimits the first via opening, a second lateral sidewall that delimits the second via opening, and a surface of the additive molding compound that extends from the first via opening to the second via opening; and forming a second conductive layer on the first conductive layer.

9. The method of claim 8, wherein exposing the laser to the resist material and the additive molding compound includes removing a portion of the resist material that extends from the first via opening to the second via opening.

10. The method of claim 8, further comprising forming a molding compound on the second conductive layer.

11. The method of claim 10, further comprising, before forming the molding compound on the second conductive layer, removing the resist material from the surface of the additive molding compound.

12. The method of claim 11, further comprising forming the molding compound on the surface of the additive molding compound.

13. The method of claim 12, further comprising forming the molding compound on one or more inactivated regions at the surface of the additive molding compound.

14. The method of claim 8, wherein forming the second conductive layer includes forming an end surface of the second conductive layer parallel with the surface of the additive molding compound and forming third lateral sidewalls of the second conductive layer that are perpendicular to the surface of the additive molding compound, that are perpendicular to the end surface, and that extend from the end surface to the surface of the additive molding compound.

15. A method, comprising:

forming an additive resin material on a leadframe including a lead portion and a die pad portion and on a die on the die pad portion of the leadframe;

forming a resist material on a surface of the additive resin material facing away from the leadframe and the die;

exposing a laser to the resist material and the additive resin material forming a first via opening extending to the lead portion, forming a second via opening extending to a contact pad of the die, removing a portion of the resist material extending from the first via opening to the second via opening, and activating a conductive additive within the additive resin material forming a first electrically-conductive formation extending along the first via opening, the second via opening, and the surface of the additive resin material between the first and second via openings; and forming a U-shaped electrically-conductive structure by forming an electrically conductive material on the electrically-conductive formation.

16. The method of claim 15, further comprising, after forming the U-shaped electrically-conductive structure, removing the resist material from the surface of the additive resin material exposing respective portions of respective lateral sidewalls of the U-shaped electrically-conductive structure.

17. The method of claim 16, further comprising forming a molding compound covering the respective portions of the respective lateral sidewalls of the U-shaped electrically-conductive structure.

18. The method of claim 1, further comprising forming a layer of a package molding compound on the resin material and on the electrically-conductive material.

19. The method of claim 18, wherein the layer of the package molding compound is a non-laser direct structuring material.

20. The method of claim 1, wherein forming the resin material further includes forming the resin material on a lead portion of a lead frame.

\* \* \* \* \*